(12) United States Patent
Moon et al.

(10) Patent No.: US 12,013,635 B2
(45) Date of Patent: *Jun. 18, 2024

(54) SEMICONDUCTOR PHOTORESIST COMPOSITION AND METHOD OF FORMING PATTERNS USING THE COMPOSITION

(71) Applicant: Samsung SDI Co., Ltd., Yongin-si (KR)

(72) Inventors: Kyungsoo Moon, Suwon-si (KR); Eunmi Kang, Suwon-si (KR); Jaehyun Kim, Suwon-si (KR); Jimin Kim, Suwon-si (KR); Changsoo Woo, Suwon-si (KR); Hwansung Cheon, Suwon-si (KR); Seungyong Chae, Suwon-si (KR); Seung Han, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/454,453

(22) Filed: Nov. 10, 2021

(65) Prior Publication Data

US 2022/0197138 A1 Jun. 23, 2022

(30) Foreign Application Priority Data

Dec. 18, 2020 (KR) .................. 10-2020-0178620

(51) Int. Cl.
*G03F 7/004* (2006.01)
*C07F 7/22* (2006.01)

(52) U.S. Cl.
CPC .......... *G03F 7/0042* (2013.01); *C07F 7/2224* (2013.01)

(58) Field of Classification Search
CPC ...... G03F 7/0042; G03F 7/004; C07F 7/2224; H01L 21/32139; H01L 21/31144
See application file for complete search history.

(56) References Cited

U.S. PATENT DOCUMENTS 2,826,597 A * 3/1958 Gloskey ................ C07F 7/2224
524/925
2,832,751 A * 4/1958 Weinberg ................ C08K 5/58
524/929

(Continued)

FOREIGN PATENT DOCUMENTS

CN 102269929 A 12/2011
CN 108351594 A 7/2018

(Continued)

OTHER PUBLICATIONS

Japanese Notice of Reasons for Rejection dated Nov. 15, 2022 issued in JP Application No. 2021-183873 (3 pages).

(Continued)

*Primary Examiner* — Mark F. Huff
*Assistant Examiner* — Andrew Preston Traywick
(74) *Attorney, Agent, or Firm* — Lewis Roca Rothgerber Christie LLP

(57) ABSTRACT

A semiconductor photoresist composition and a method of forming patterns utilizing the same are provided. The semiconductor photoresist composition includes a condensed product produced by a condensation reaction between an organotin compound represented by Chemical Formula 1 and at least one organic acid compound selected from a substituted organic acid, an organic acid including at least two acid functional groups, and a substituted or unsubstituted sulfonic acid; and a solvent.

(Continued)

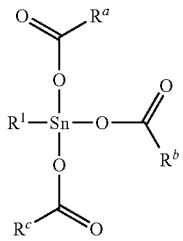

Chemical Formula 1

Specific details of Chemical Formula 1 are as defined in the specification.

11 Claims, 3 Drawing Sheets

(56) References Cited

U.S. PATENT DOCUMENTS

| | | | |
|---|---|---|---|
| 5,061,599 | A | 10/1991 | Kudo et al. |
| 6,103,448 | A | 8/2000 | Kim et al. |
| 6,514,666 | B1 | 2/2003 | Choi et al. |
| 6,607,867 | B1 | 8/2003 | Kim et al. |
| 2002/0072009 | A1 | 6/2002 | Kim et al. |
| 2011/0045406 | A1 | 2/2011 | Keszler et al. |
| 2011/0293888 | A1 | 12/2011 | Stowers et al. |
| 2012/0208127 | A1 | 8/2012 | Hatakeyama |
| 2013/0005150 | A1 | 1/2013 | Ogihara et al. |
| 2013/0224652 | A1 | 8/2013 | Bass et al. |
| 2015/0056542 | A1 | 2/2015 | Meyers et al. |
| 2016/0116839 | A1* | 4/2016 | Meyers ............... G03F 7/2004 430/326 |
| 2016/0310944 | A1 | 10/2016 | Nishimura et al. |
| 2017/0009062 | A1* | 1/2017 | Kimura ............... C08K 9/06 |
| 2017/0052449 | A1 | 2/2017 | Nakagawa et al. |
| 2017/0102612 | A1* | 4/2017 | Meyers ............... G03F 7/0042 |
| 2018/0046086 | A1 | 2/2018 | Waller et al. |
| 2019/0033713 | A1 | 1/2019 | Kasahara et al. |
| 2019/0227432 | A1 | 7/2019 | Shiratani |
| 2019/0243243 | A1 | 8/2019 | Naito et al. |
| 2019/0337969 | A1 | 11/2019 | Odedra et al. |
| 2019/0384171 | A1 | 12/2019 | Zi et al. |
| 2020/0041896 | A1 | 2/2020 | Moon et al. |
| 2020/0041897 | A1 | 2/2020 | Moon et al. |
| 2020/0041901 | A1 | 2/2020 | Namgung et al. |
| 2020/0073238 | A1 | 3/2020 | Zi et al. |
| 2020/0117085 | A1 | 4/2020 | Moon et al. |
| 2020/0348591 | A1 | 11/2020 | Kim et al. |
| 2021/0311387 | A1 | 10/2021 | Woo et al. |
| 2021/0356861 | A1 | 11/2021 | Han et al. |
| 2022/0197138 | A1 | 6/2022 | Moon et al. |

FOREIGN PATENT DOCUMENTS

| | | |
|---|---|---|
| CN | 111856879 A | 10/2020 |
| JP | H8-260159 A | 10/1996 |
| JP | 3990146 B2 | 10/2007 |
| JP | 2009-229593 A | 10/2009 |
| JP | 4831324 B2 | 12/2011 |
| JP | 5178858 B2 | 4/2013 |
| JP | 5650086 B2 | 1/2015 |
| JP | 5708521 B2 | 4/2015 |
| JP | 2017-207532 A | 11/2017 |
| JP | 2018-502173 A | 1/2018 |
| JP | 2018-017780 A | 2/2018 |
| JP | 2018-041099 A | 3/2018 |
| JP | 2019-500490 A | 1/2019 |
| JP | 2019-183150 A | 10/2019 |
| JP | 2019-532489 A | 11/2019 |
| JP | 2020-21071 A | 2/2020 |
| JP | 2020-530199 A | 10/2020 |
| JP | 2020-184074 A | 11/2020 |
| KR | 1995-0001702 B1 | 2/1995 |
| KR | 10-0269513 B1 | 10/2000 |
| KR | 2002-0041759 A | 6/2002 |
| KR | 10-0398312 B1 | 9/2003 |
| KR | 10-0386719 B1 | 5/2004 |
| KR | 10-2014-0121826 A | 10/2014 |
| KR | 10-1486533 B1 | 2/2015 |
| KR | 10-2017-0022945 A | 3/2017 |
| KR | 10-2017-0132726 A | 12/2017 |
| KR | 10-2018-0043170 A | 4/2018 |
| KR | 10-2019-0045162 A | 5/2019 |
| KR | 10-2019-0082279 A | 7/2019 |
| KR | 10-2020-0005370 A | 1/2020 |
| KR | 10-2020-0014043 A | 2/2020 |
| KR | 10-2020-0014185 A | 2/2020 |
| KR | 10-2020-0014216 A | 2/2020 |
| KR | 10-2020-0018080 A | 2/2020 |
| KR | 10-2021-0094420 A | 7/2021 |
| KR | 10-2021-0123138 A | 10/2021 |
| KR | 10-2021-0138416 A | 11/2021 |
| TW | 201920214 A | 6/2019 |
| TW | 201924927 A | 7/2019 |
| TW | I669353 B | 8/2019 |
| TW | 202007691 A | 2/2020 |
| TW | I684063 B | 2/2020 |
| TW | 202041513 A | 11/2020 |
| WO | WO 2016/140057 A1 | 9/2016 |
| WO | WO 2017/169440 A1 | 10/2017 |
| WO | WO 2018/043506 A1 | 3/2018 |
| WO | WO 2018/046438 A1 | 3/2018 |
| WO | WO 2018/168221 A1 | 9/2018 |
| WO | WO 2018/179704 A1 | 10/2018 |

OTHER PUBLICATIONS

Taiwanese Search Report dated Jun. 25, 2022, for Application No. 110143319, 2 pages.
Christopher N. Anderson, et al., "The SEMATECH Berkeley MET: extending EUV learning down to 16nm half pitch", Proceedings of SPIE, Apr. 5, 2011, pp. 79690R-1 to 79690R-6 vol. 7969, SPIE Advanced Lithography, San Jose, California, United States.
Hiroshi Okamoto, et al., "Peroxopolytungstic acids: A new inorganic resist material", Applied Physics Letters, Aug. 4, 1986, pp. 298-300, vol. 49, No. 5, American Institute of Physics.
Jason K. Stowers, et al., "Directly patterned inorganic hardmask for EUV lithography", Proceedings of SPIE, Apr. 7, 2011, pp. 796915-1 to 796915-11, vol. 7969, SPIE Advanced Lithography, San Jose, California, United States.
Okamoto, Hiroshi et al., "Peroxypolytungstic acids: A new inorganic resist material", Applied Physics Letters, Aug. 4, 1986, 49 (5), pp. 298-300.
JPO Office action dated May 25, 2021 issued in corresponding JP Application No. 2020-080534, 4 pages.
U.S. Non-Final Rejection issued in U.S. Appl. No. 16/859,682, dated Dec. 20, 2021, 12 pages.
Taiwanese Office Action dated Nov. 8, 2021, in Taiwanese Patent Application No. 109114182 and accompanying Search Report (6 pages).
TW Office Action and Search Report dated Nov. 16, 2021 in corresponding Taiwanese Patent Application No. 110116951, 7 pages.
U.S. Notice of Allowance dated Apr. 13, 2022, issued in U.S. Appl. No. 16/859,682, 8 pages.
Japanese Office Action for JP Application No. 2021-056503 dated Mar. 29, 2022, 3 pages.
Taiwanese Office Action for TW Application No. 110111615 dated Apr. 29, 2022, 5 pages.
U.S. Notice of Allowance dated Jul. 29, 2022, issued in U.S. Appl. No. 16/859,682 (7 pages).
U.S. Notice of Allowance dated Nov. 9, 2022, issued in U.S. Appl. No. 16/859,682 (7 pages).
Notice of Reason for Rejection for JP Application No. 2021-078454 dated Jun. 7, 2022, 3 pages.

(56) References Cited

OTHER PUBLICATIONS

U.S. Restriction Requirement dated Jan. 3, 2023, issued in U.S. Appl. No. 17/306,820 (6 pages).
U.S. Office Action dated May 10, 2023, issued in U.S. Appl. No. 17/306,820 (8 pages).
Korean Office Action dated May 12, 2023, issued in Korean Patent Application No. 10-2020-0040507 (7 pages).
Korean Office Action dated May 12, 2023, issued in Korean Patent Application No. 10-2020-0056720 (7 pages).
US Office Action dated Apr. 10, 2024, issued in U.S. Appl. No. 17/454,447 (6 pages).
Japanese Office Action dated Nov. 29, 2022, issued in Japanese Patent Application No. 2021-183254 (2 pages).
Abstract of corresponding document U.S. Pat. No. 2018046086 (A1) for JP 2019-532489 A (2 pp.).
Abstract of corresponding document CA2975104 (A1) for JP 2020-530199 A (1 pp.).
Taiwanese Search Report dated Jul. 6, 2022, for Application No. 110144655, 2 pages.
Korean Office Action dated Oct. 23, 2023, issued in Korean Patent Application No. 10-2020-0178616 (5 pages).
Korean Notice of Allowance dated Oct. 23, 2023, issued in Korean Patent Application No. 10-2020-0178620 (3 pages).
Japanese Notice of Allowance dated Nov. 14, 2023, issued in Japanese Patent Application No. 2021-183254 (3 pages).
US Office Action dated Oct. 5, 2023, issued in U.S. Appl. No. 17/454,447 (13 pages).

\* cited by examiner

SEMICONDUCTOR PHOTORESIST COMPOSITION AND METHOD OF FORMING PATTERNS USING THE COMPOSITION

CROSS-REFERENCE TO RELATED APPLICATION

This application claims priority to and the benefit of Korean Patent Application No. 10-2020-0178620, filed in the Korean Intellectual Property Office on Dec. 18, 2020, the entire content of which is incorporated herein by reference.

BACKGROUND

1. Field

This disclosure relates to a semiconductor photoresist composition and a method of forming patterns utilizing the same.

2. Description of the Related Art

EUV (extreme ultraviolet) lithography is being pursued as an important (or even essential) technology for manufacturing next generation semiconductor devices. The EUV lithography is a pattern-forming technology that utilizes an EUV ray having a wavelength of 13.5 nm as an exposure light source. Utilizing the EUV lithography, an extremely fine pattern (e.g., a pattern having a feature of less than or equal to 20 nm) may be formed in an exposure process during manufacturing of a semiconductor device.

The extreme ultraviolet (EUV) lithography is realized through the development of compatible photoresists which can be performed at (e.g., applied with) a spatial resolution of less than or equal to 16 nm. Currently, efforts to satisfy (e.g., remedy or overcome) insufficient (e.g., less than desirable) specifications (e.g., issues) of related art chemically amplified (CA) photoresists such as resolution, photospeed, and/or feature roughness (or also referred to as a line edge roughness or LER) for the next generation device are being made.

An intrinsic image blurring due to an acid catalyzed reaction in these polymer-type photoresists (e.g., polymer-based photoresists) may limit a resolution in small feature sizes, which has been a known phenomenon in electron beam (e-beam) lithography for a long time. The chemically amplified (CA) photoresists are designed for high sensitivity, but because their typical composition (e.g., elemental makeups) may reduce light absorbance of the photoresists at a wavelength of 13.5 nm and thus, the chemically amplified (CA) photoresists may have decreased sensitivity, and may at least partially have more difficulties under an EUV exposure.

In addition, the CA photoresists may have difficulties in (e.g., producing) the small feature sizes due to roughness issues, and line edge roughness (LER) of the CA photoresists have been found to increase (e.g., experimentally turns out to be increased), as a photospeed is decreased partially due to an essence (e.g., the nature) of acid catalyst processes. Accordingly, a novel high performance photoresist is desired in a semiconductor industry because of these defects and problems of the CA photoresists.

In order to overcome the aforementioned drawbacks of the chemically amplified (CA) organic photosensitive composition, an inorganic photosensitive composition has been researched. The inorganic photosensitive composition is mainly utilized for negative tone patterning having resistance against removal by a developer composition due to chemical modification through nonchemical amplification mechanism. The inorganic composition contains an inorganic element having a higher EUV absorption rate than hydrocarbons and thus may secure sensitivity through the nonchemical amplification mechanism and in addition, is less sensitive to a stochastic effect and thus is suitable to have (e.g., can have) low line edge roughness and small number of defects.

Inorganic photoresists based on peroxopolyacids of tungsten mixed with tungsten, niobium, titanium, and/or tantalum have been reported as radiation sensitive materials for patterning (for example, in U.S. Pat. No. 5,061,599 and in H. Okamoto, T. Iwayanagi, K. Mochiji, H. Umezaki, T. Kudo, Applied Physics Letters, 49 5, 298-300, 1986, the entire contents of all of which are incorporated herein by reference).

These materials are effective for patterning large pitches for a bilayer configuration utilizing far ultraviolet (deep UV), X-ray, and/or electron beam sources. More recently, when cationic hafnium metal oxide sulfate (HfSOx) materials along with a peroxo complexing agent has been utilized to image a 15 nm half-pitch (HP) through projection EUV exposure, desired or impressive performance has been obtained (for example, in US 2011-0045406 and in J. K. Stowers, A. Telecky, M. Kocsis, B. L. Clark, D. A. Keszler, A. Grenville, C. N. Anderson, P. P. Naulleau, Proc. SPIE, 7969, 796915, 2011, the entire contents of all of which are incorporated herein by reference). Such system exhibits suitable (e.g., the highest) performance of a non-CA photoresist and has a practicable photospeed close to that desired for an EUV photoresist. However, the hafnium metal oxide sulfate materials having the peroxo complexing agent have a few practical drawbacks. First, these materials are coated in a mixture of corrosive sulfuric acid/hydrogen peroxide and have insufficient shelf-life stability. Second, a structural change thereof for performance improvement as a composite mixture is not easy. Third, development is performed in a TMAH (tetramethylammonium hydroxide) solution at an extremely high concentration of 25 wt % and/or the like.

SUMMARY

One or more aspects of embodiments of the present disclosure are directed toward a semiconductor photoresist composition having suitable (e.g., excellent) sensitivity and storage stability.

One or more aspects of embodiments of the present disclosure are directed toward a method of forming a pattern utilizing the semiconductor photoresist composition.

A semiconductor photoresist composition according to an embodiment includes a condensed product produced by a condensation reaction between an organotin compound represented by Chemical Formula 1 and at least one organic acid compound selected from a substituted organic acid, an organic acid including at least two acid functional groups, and a substituted or unsubstituted sulfonic acid; and a solvent.

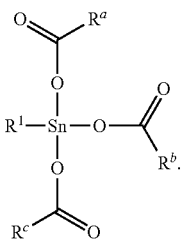

Chemical Formula 1

In Chemical Formula 1, $R^1$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or -L-O—$R^d$, $R^a$, $R^b$, and $R^c$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group, L is a single bond, or a substituted or unsubstituted C1 to C20 alkylene group, and $R^d$ is a substituted or unsubstituted C1 to C20 alkyl group.

A weight ratio of the organotin compound and the organic acid compound is about 85:15 to about 99:1.

The substituted organic acid may be substituted with at least one of a heteroatom, an atomic group including the heteroatom, and a combination thereof, and the heteroatom may be at least one of sulfur (S), nitrogen (N), oxygen (O), phosphorus (P), or fluorine (F), and the atomic group including the heteroatom may be at least one of —OH, —SH, —NH$_2$, —S—, or —SS—.

The organic acid compound may be at least one of glycolic acid, malonic acid, succinic acid, 1,2,3,4-butane tetracarboxylic acid, citric acid, tartaric acid, tricarballylic acid, lactic acid, thioglycolic acid, dithiodiglycolic acid, thiodiglycolic acid, phthalic acid, maleic acid, L-aspartic acid, p-toluene sulfonic acid, methyl sulfonic acid, or benzene sulfonic acid.

The organic acid compound may have a pKa of less than or equal to about 5.

The condensed product may be at least one of an oligomer, a polymer, or a combination thereof.

The condensed product may include a hydrolysis condensed product.

The semiconductor photoresist composition may further include an additive selected from a surfactant, a crosslinking agent, a leveling agent, and combinations thereof.

A method of forming a pattern according to an embodiment includes: forming an etching-objective layer on a substrate; coating the semiconductor photoresist composition on the etching-objective layer to form a photoresist layer; patterning the photoresist layer to form a photoresist pattern; and etching the etching-objective layer utilizing the photoresist pattern as an etching mask.

The photoresist pattern may be formed utilizing light having a wavelength of about 5 nm to about 150 nm.

The method of forming patterns may further include providing a resist underlayer between the substrate and the photoresist layer.

The photoresist pattern may have a width of about 5 nm to about 100 nm.

The semiconductor photoresist composition according to an embodiment has desired (e.g., excellent) storage stability and sensitivity characteristics, and by utilizing it, it is possible to provide a photoresist pattern having suitable (e.g., excellent) sensitivity and a high aspect ratio, in which the pattern does not collapse.

DETAILED DESCRIPTION

Figure 1:
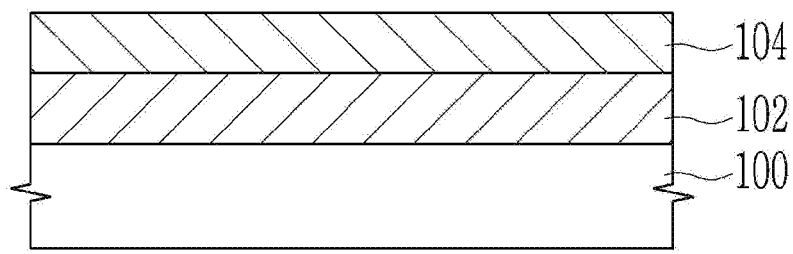
FIGS. 1-5 are cross-sectional views for explaining a method of forming patterns utilizing a semiconductor photoresist composition according to an embodiment.

Hereinafter, referring to the drawings, embodiments of the present disclosure are described in more detail. In the following description of the present disclosure, the well-known functions or constructions will not be described in order to clarify (e.g., focus on) the subject matter of the present disclosure.

In order to clearly illustrate the subject matter of the present disclosure, throughout the disclosure, the same or similar configuration elements are designated by the same reference numerals. Also, because the size and thickness of each configuration shown in the drawing are arbitrarily shown for better understanding and ease of description, the present disclosure is not necessarily limited thereto.

In the drawings, the thicknesses of layers, films, panels, regions, etc., may be exaggerated for clarity. In the drawings, the thickness of a part of a layer, a region, etc., may be exaggerated for clarity. It will be understood that when an element such as a layer, film, region, or substrate is referred to as being "on" another element, it can be directly on the other element or intervening elements may also be present.

As used herein, the term "substituted" refers to replacement of a hydrogen atom of any given compound or functional group by at least one selected from deuterium, a halogen atom, a hydroxy group, an amino group, a substituted or unsubstituted C1 to C30 amine group, a nitro group, a substituted or unsubstituted C1 to C40 silyl group (for example, a C1 to C10 alkylsilyl group), a C1 to C30 alkyl group, a C1 to C10 haloalkyl group, a C3 to C30 cycloalkyl group, a C6 to C30 aryl group, a C1 to C20 alkoxy group, and a cyano group. The term "unsubstituted" as used herein refers to non-replacement of a hydrogen atom of any given compound or functional group by another substituent (e.g., none of the hydrogen atom(s) are replaced by another substituent).

As used herein, when a definition is not otherwise provided, the term "an alkyl group" refers to a linear or branched aliphatic hydrocarbon group. The alkyl group may be "a saturated alkyl group" without any double bond or triple bond.

The alkyl group may be a C1 to C20 alkyl group. For example, the alkyl group may be a C1 to C10 alkyl group or a C1 to C6 alkyl group. For example, the term "C1 to C4 alkyl group" refers to that the alkyl chain contains 1 to 4 carbon atoms, and may be selected from a methyl group, an ethyl group, a propyl group, an iso-propyl group, an n-butyl group, an iso-butyl group, a sec-butyl group, and a t-butyl group.

Examples of the alkyl group may include a methyl group, an ethyl group, a propyl group, an isopropyl group, a butyl group, an isobutyl group, a t-butyl group, a pentyl group, a hexyl group, a cyclopropyl group, a cyclobutyl group, a cyclopentyl group, a cyclohexyl group, and/or the like.

As used herein, when a definition is not otherwise provided, the term "cycloalkyl group" refers to a monovalent cyclic aliphatic hydrocarbon group.

As used herein, when a definition is not otherwise provided, the term "alkenyl group" refers to an aliphatic unsaturated alkenyl group including at least one double bond as a linear or branched aliphatic hydrocarbon group.

As used herein, when a definition is not otherwise provided, the term "alkynyl group" refers to an aliphatic unsaturated alkynyl group including at least one triple bond as a linear or branched aliphatic hydrocarbon group.

As used herein, the term "aryl group" refers to a substituent in which all atoms in the cyclic substituent have a p-orbital and these p-orbitals are conjugated and may include a monocyclic or fused ring polycyclic functional group (i.e., rings sharing adjacent pairs of carbon atoms).

Hereinafter, a semiconductor photoresist composition according to an embodiment is described.

Recently, active research has been conducted with the knowledge that molecules containing tin have suitable (e.g., excellent) absorption of extreme ultraviolet rays. As for an organotin polymer among them, alkyl ligands are dissociated by light absorption or secondary electrons produced thereby, and are crosslinked with adjacent chains through oxo bonds and thus enable the negative tone patterning which may not be removed by an organic developing solution.

However, such an organotin-based photoresist has a disadvantage in that it is sensitive to moisture.

The semiconductor photoresist composition according to an embodiment of the present disclosure includes a condensed product and a solvent, wherein the condensed product is formed by a condensation reaction of an organotin compound represented by Chemical Formula 1, and at least one organic acid compound selected from a substituted organic acid, an organic acid including at least two acid functional groups, and a substituted or unsubstituted sulfonic acid.

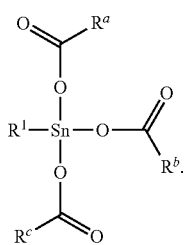

Chemical Formula 1

In Chemical Formula 1, $R^1$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or -L-O—$R^d$, $R^a$, $R^b$, and $R^c$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or a combination thereof, L is a single bond, or a substituted or unsubstituted C1 to C20 alkylene group, and $R^d$ is a substituted or unsubstituted C1 to C20 alkyl group.

As used herein, the term "condensed product" refers to a product produced by a condensation reaction. The condensation reaction refers to a reaction in which at least two organic compound molecules are combined with active (e.g., reactive) atoms or atomic groups as a center to release single molecules such as water, ammonia, hydrogen chloride, and/or the like. Herein, a compound produced by simply combining two molecules (e.g., without releasing any single molecules) is also intended to be included in the category of condensed product.

The condensed product may include a monomer, an oligomer, a polymer, and a combination thereof.

In some embodiments, $R^1$ of Chemical Formula 1 may be a substituted or unsubstituted C1 to C20 alkyl group, a substituted or unsubstituted C2 to C20 alkenyl group, a substituted or unsubstituted C2 to C20 alkynyl group, or a combination thereof.

In some embodiments, $R^1$ of Chemical Formula 1 may be a substituted or unsubstituted C3 to C20 alkyl group.

For example, $R^1$ of Chemical Formula 1 may be an iso-propyl group, an n-butyl group, an iso-butyl group, a sec-butyl group, a ter-butyl group, or a combination thereof.

In some embodiments, $R^a$, $R^b$, and $R^c$ of Chemical Formula 1 may each independently be a substituted or unsubstituted C1 to C20 alkyl group, a substituted or unsubstituted C2 to C20 alkenyl group, a substituted or unsubstituted C2 to C20 alkynyl group, or a combination thereof.

For example, $R^a$, $R^b$, and $R^c$ may each independently be a methyl group, an ethyl group, an n-propyl group, an iso-propyl group, an n-butyl group, an iso-butyl group, a sec-butyl group, a ter-butyl group, an ethenyl group, or a combination thereof.

$R^a$, $R^b$, and $R^c$ may be the same as or different from one another.

In some embodiments, the substituted organic acid may be substituted with at least one of a heteroatom, an atomic group including a heteroatom, or a combination thereof, the heteroatom may be at least one of sulfur (S), nitrogen (N), oxygen (O), phosphorus (P), or fluorine (F), and the atomic group including the heteroatom may be at least one of —OH, —SH, —NH$_2$, —S—, or —S—S—.

In the present specification, the substituted organic acid may, for example, refer to that at least one of carbon (C) or hydrogen (H) included in a hydrocarbon chain to which the acid functional group is linked is substituted with at least one of a heteroatom, an atomic group including a heteroatom, or a combination thereof while containing one (e.g., at least one) acid functional group.

For example, the substituted organic acid may include at least one of carbon (C) or hydrogen (H) at the terminal end of a hydrocarbon chain to which the acid functional group is linked, at least one of carbon (C) or hydrogen (H) in the middle of the hydrocarbon chain, or a combination thereof may be substituted with at least one of a heteroatom, an atomic group including a heteroatom, or a combination thereof. For example, the substituted organic acid may include at least one carbon atom and/or hydrogen atom in the main chain and/or at the terminal end of a hydrocarbon chain (to which an acid functional group is linked) that is substituted with a heteroatom, an atomic group including a heteroatom, or a combination thereof.

Examples of the substituted organic acid may include glycolic acid, lactic acid, thioglycolic acid, and L-aspartic acid.

In the present specification, the acid functional group may be, for example, a carboxyl group.

The organic acid including at least two acid functional groups may be, for example, an organic acid including 2 to 4 acid functional groups and examples of the organic acid may include malonic acid, succinic acid, 1,2,3,4-butane tetracarboxylic acid, citric acid, tartaric acid, tricarballylic acid, dithiodiglycolic acid, thiodiglycolic acid, phthalic acid, and maleic acid.

In some embodiments, in the present specification, a substituted or unsubstituted sulfonic acid refers to an organic acid including at least one —S(O)$_2$OH group.

Examples of the substituted or unsubstituted sulfonic acid may include p-toluene sulfonic acid, methyl sulfonic acid, and benzene sulfonic acid.

In some embodiments, the organic acid compound may have a pKa value of less than or equal to about 5, for example, less than or equal to about 4.

The pKa is a value obtained by taking a minus log (–log) of an acid dissociation constant Ka when an acid (HA) is dissociated into H$^+$ and A$^-$ in an aqueous solution, and the larger the pKa value, the weaker the acid. When two or more acid-dissociating functional groups exist in one organic acid molecule, the pKa value of the molecule is determined as the value of the functional group having the lowest pKa.

When the pKa value of the organic acid compound is within the above ranges, it is easy to form a condensed product with the organotin compound. As the condensed product is formed of an oligomer or higher (e.g., larger) polymer, penetration of external moisture may be reduced.

Accordingly, the storage stability of the semiconductor photoresist composition including the condensed product formed by the condensation reaction of the organotin compound represented by Chemical Formula 1 and the organic acid compound may be improved.

In the condensed product formed by the condensation reaction of the organotin compound represented by Chemical Formula 1 and the organic acid compound, the group derived from the organic acid compound serves as a ligand and links (e.g., bonds with) the organotin compound, and thus the condensed product as a final product may be at least one of an oligomer, a polymer, or a combination thereof.

For example, the condensed product may include a hydrolysis condensed product.

The condensed product may include the organotin compound and the organic acid compound (e.g., groups derived from the organotin compound and groups derived from the organic acid compound) in a weight ratio of about 85:15 to about 99:1, and within the above range, film-forming properties, solubility, refractive index, and solubility rate in a developer may be enhanced. For example, a weight ratio of the organotin compound and the organic acid compound in the condensation reaction may be about 85:15 to about 99:1.

For example, the condensed product may include the organotin compound and the organic acid compound (e.g., groups derived from the organotin compound and groups derived from the organic acid compound) in a weight ratio of about 90:10 to about 99:1, or, about 90:10 to about 97:3.

In some embodiments, the condensed product may have a weight average molecular weight (Mw) of about 1,000 g/mol to about 30,000 g/mol, for example, about 1,000 g/mol to about 20,000 g/mol, or about 1,000 g/mol to about 10,000 g/mol. When the weight average molecular weight (Mw) is within the above ranges, film-forming properties, solubility, refractive index and/or dissolution rate in a developer may be enhanced.

Conditions for obtaining the condensed product are not particularly limited.

For example, the organotin compound represented by Chemical Formula 1 and the organic acid compound may be diluted in a solvent such as PGMEA (propylene glycol monomethyl ether acetate), ethanol, 2-propanol, acetone, and/or butyl acetate. In some embodiments, the desired condensed product may be obtained by adding water and an acid (hydrochloric acid, acetic acid, nitric acid, etc.) as a catalyst for the reaction, followed by stirring to complete the polymerization (e.g., condensation) reaction.

The type (e.g., kind) and/or amount of the solvent, and/or acid or base catalyst utilized herein may be arbitrarily (e.g., suitably) selected without limitation. The suitable (e.g., required) reaction time varies depending on the type (e.g., kind), concentration, reaction temperature, etc. of the reactants, and in some embodiments, the reaction time is about 15 minutes to about 30 days. However, the reaction time is not limited to this range.

In the case of a generally-utilized photoresist composition of the related art, the etch resistance may be insufficient and the pattern may collapse at a high aspect ratio.

On the other hand, it is desirable that the semiconductor photoresist composition according to an embodiment includes (e.g., consists of) the aforementioned condensed product and a solvent.

The solvent included in the semiconductor photoresist composition according to an embodiment may be an organic solvent, for example, aromatic compounds (e.g., xylene, and/or toluene), alcohols (e.g., 4-methyl-2-pentenol, 4-methyl-2-propanol, 1-butanol, methanol, isopropyl alcohol, 1-propanol, and/or propylene glycol monomethyl ether), ethers (e.g., anisole, and/or tetrahydrofuran), esters (n-butyl acetate, propylene glycol monomethyl ether acetate, ethyl acetate, and/or ethyl lactate), ketones (e.g., methyl ethyl ketone, and/or 2-heptanone), a mixture thereof, and/or the like, but the present disclosure is not limited thereto.

The semiconductor photoresist composition according to an embodiment may further include an additive in some embodiments. Examples of the additive may include a surfactant, a crosslinking agent, a leveling agent, or a combination thereof.

The surfactant may be, for example, an alkylbenzenesulfonic acid salt, an alkyl pyridinium salt, polyethylene glycol, a quaternary ammonium salt, or a combination thereof, but the present disclosure is not limited thereto.

The crosslinking agent may be, for example, a melamine-based crosslinking agent, a substituted urea-based crosslinking agent, an acryl-based crosslinking agent, an epoxy-based crosslinking agent, and/or a polymer-based crosslinking agent, but the present disclosure is not limited thereto. The crosslinking agent may include at least two crosslinking forming substituents, for example, the crosslinking agent may include a compound such as methoxy methylated glycoluril, butoxymethylated glycoluril, methoxymethylated melamine, butoxymethylated melamine, methoxymethylated benzoguanamine, butoxymethylated benzoguanamine, 4-hydroxybutyl acrylate, acrylic acid, urethane acrylate, acryl methacrylate, 1,4-butanediol diglycidyl ether, glycidol, diglycidyl 1,2-cyclohexane dicarboxylate, trimethylpropane triglycidyl ether, 1,3-bis(glycidoxypropyl)tetramethyldisiloxane, methoxymethylated urea, butoxymethylated urea, or methoxymethylated thiourea, and/or the like.

The leveling agent may be utilized for improving coating flatness during printing and may be a commercially available (e.g., known) leveling agent.

An amount of the additives utilized may be controlled depending on desired properties.

In addition, the semiconductor photoresist composition may further include a silane coupling agent as an adherence (e.g., adhesion) enhancer in order to improve a close-contacting force (e.g., adhesion force) with the substrate (e.g., in order to improve adherence of the semiconductor photoresist composition to the substrate). The silane coupling agent may include (e.g., may be), for example, a silane compound including a carbon-carbon unsaturated bond such as vinyltrimethoxysilane, vinyltriethoxysilane, vinyl trichlorosilane, vinyltris(β-methoxyethoxy)silane, 3-methacryloxypropyltrimethoxysilane, 3-acryloxypropyltrimethoxysilane, p-styryl trimethoxysilane, 3-methacryloxypropylmethyldimethoxysilane, 3-methacryloxypropylmethyl diethoxysilane, trimethoxy[3-(phenylamino)propyl]silane, and/or the like, but the present disclosure is not limited thereto.

The semiconductor photoresist composition may be formed into a pattern having a high aspect ratio without (or with a very low) risk of collapse. Accordingly, in order to form a fine pattern having a width of, for example, about 5 nm to about 100 nm, about 5 nm to about 80 nm, about 5 nm to about 70 nm, about 5 nm to about 50 nm, about 5 nm to about 40 nm, about 5 nm to about 30 nm, or about 5 nm to about 20 nm, the semiconductor photoresist composition may be utilized for a photoresist process utilizing light in a wavelength ranging from about 5 nm to about 150 nm, for example, about 5 nm to about 100 nm, about 5 nm to about 80 nm, about 5 nm to about 50 nm, about 5 nm to about 30 nm, or about 5 nm to about 20 nm. Accordingly, the semiconductor photoresist composition according to an embodiment may be utilized to realize extreme ultraviolet lithography utilizing an EUV light source having a wavelength of about 13.5 nm.

According to another embodiment, a method of forming patterns utilizing the aforementioned semiconductor photoresist composition is provided. In some embodiments, the manufactured pattern may be a photoresist pattern. For example, it may be a negative photoresist pattern.

The method of forming patterns according to an embodiment includes forming an etching-objective layer on a substrate, coating the semiconductor photoresist composition on the etching-objective layer to form a photoresist layer, patterning the photoresist layer to form a photoresist pattern, and etching the etching-objective layer utilizing the photoresist pattern as an etching mask.

Hereinafter, a method of forming patterns utilizing the semiconductor photoresist composition is described referring to FIGS. 1 to 5. FIGS. 1 to 5 are cross-sectional views for explaining a method of forming patterns utilizing a semiconductor photoresist composition according to an embodiment.

Referring to FIG. 1, an object for etching is prepared. The object for etching may be a thin film 102 formed on a semiconductor substrate 100. Hereinafter, as an example, the object for etching is limited to the thin film 102. A whole surface of the thin film 102 is washed to remove impurities and/or the like remaining thereon. The thin film 102 may be, for example, a silicon nitride layer, a polysilicon layer, and/or a silicon oxide layer.

Subsequently, the resist underlayer composition for forming a resist underlayer 104 is spin-coated on the surface of the washed thin film 102. However, the present disclosure is not limited thereto, and various suitable (e.g., known) coating methods, for example, a spray coating, a dip coating, a knife edge coating, a printing method (for example an inkjet printing and/or a screen printing), and/or the like may be utilized.

In some embodiments, the coating process of the resist underlayer may be omitted, and hereinafter, a process including a coating of the resist underlayer is described.

Then, the coated composition is dried and baked to form a resist underlayer 104 on the thin film 102. The baking may be performed at about 100° C. to about 500° C., for example, about 100° C. to about 300° C.

The resist underlayer 104 is formed between the substrate 100 and a photoresist layer 106 and thus may prevent or reduce non-uniformity and may improve pattern-forming capability of a photoresist line width when a ray reflected from the interface (e.g., between the substrate 100 and the photoresist layer 106 or a hardmask) between layers is scattered into an unintended photoresist region.

Figure 2:
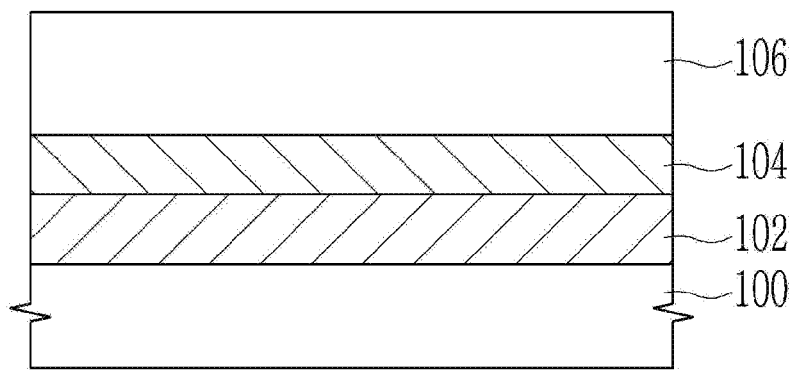

Referring to FIG. 2, the photoresist layer 106 is formed by coating the semiconductor photoresist composition on the resist underlayer 104. The photoresist layer 106 is obtained by coating the aforementioned semiconductor photoresist composition on the thin film 102 formed on the substrate 100 and then, curing it through a heat treatment.

For example, the formation of a pattern by utilizing the semiconductor photoresist composition may include coating the semiconductor photoresist composition on the substrate 100 having the thin film 102 thereon through spin coating, slit coating, inkjet printing, and/or the like and then, drying it to form the photoresist layer 106.

The semiconductor photoresist composition has already been illustrated in detail and may not be provided again.

Subsequently, the substrate 100 having the photoresist layer 106 thereon is subjected to a first baking process. The first baking process may be performed at about 80° C. to about 120° C.

Figure 3:
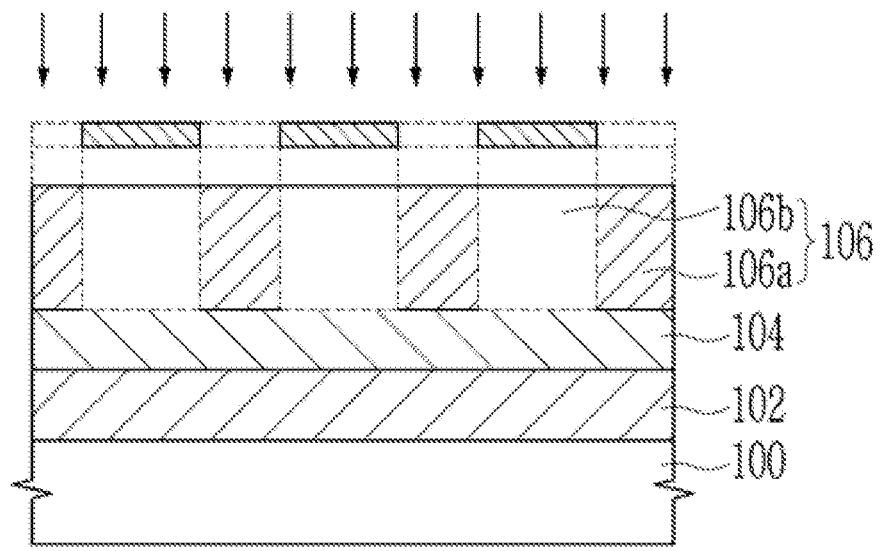

Referring to FIG. 3, the photoresist layer 106 may be selectively exposed.

In some embodiments, the exposure may utilize an activation radiation with light having a high energy wavelength such as EUV (extreme ultraviolet; a wavelength of 13.5 nm), an E-Beam (an electron beam), and/or the like as well as a short wavelength such as an i-line (a wavelength of 365 nm), a KrF excimer laser (a wavelength of 248 nm), an ArF excimer laser (a wavelength of 193 nm), and/or the like.

For example, light for the exposure according to an embodiment may have a short wavelength ranging from about 5 nm to about 150 nm and a high energy wavelength, for example, EUV (extreme ultraviolet; having a wavelength of about 13.5 nm), an E-Beam (an electron beam), and/or the like.

In the forming of the photoresist pattern, a negative pattern may be formed.

The exposed region 106a of the photoresist layer 106 has a different solubility from the non-exposed region 106b of the photoresist layer 106 by forming a polymer through a crosslinking (e.g., curing) reaction (such as condensation between organometallic compounds).

Subsequently, the substrate 100 is subjected to a second baking process. The second baking process may be performed at a temperature of about 90° C. to about 200° C. The exposed region 106a of the photoresist layer 106 becomes easily indissoluble regarding a developing solution due to the second baking process. That is, through the second baking process, the exposed region 106a of the photoresist layer 106 may become insoluble in a developing solution.

Figure 4:
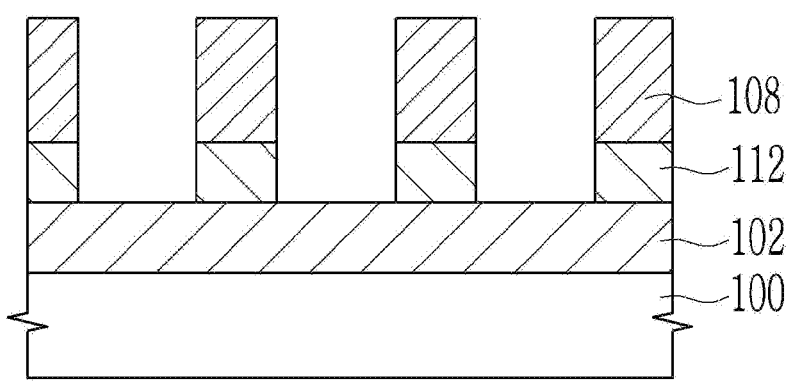

In FIG. 4, the non-exposed region 106b of the photoresist layer is dissolved and removed utilizing the developing solution to form a photoresist pattern 108. For example, the non-exposed region 106b of the photoresist layer is dissolved and removed by utilizing an organic solvent (such as propylene glycol monomethyl ether acetate (PGMEA) and/or the like) to complete the photoresist pattern 108 corresponding to the negative tone image.

As described above, the developing solution utilized in the method of forming patterns according to an embodiment may be an organic solvent. The organic solvent utilized in the method of forming patterns according to an embodiment may be, for example, one or more ketones (such as methylethylketone, acetone, cyclohexanone, 2-heptanone, and/or the like), one or more alcohols (such as 4-methyl-2-propanol, 1-butanol, isopropanol, 1-propanol, methanol, and/or the like), one or more esters (such as propylene glycol monomethyl ether acetate, ethyl acetate, ethyl lactate, n-butyl acetate, butyrolactone, and/or the like), one or more aromatic compounds (such as benzene, xylene, toluene, and/or the like), or a combination thereof.

As described above, exposure to light having a high energy such as EUV (extreme ultraViolet; having a wavelength of about 13.5 nm), an E-Beam (an electron beam), and/or the like as well as light having a wavelength such as i-line (wavelength of about 365 nm), KrF excimer laser (wavelength of about 248 nm), ArF excimer laser (wavelength of about 193 nm), and/or the like may provide a photoresist pattern 108 having a width of about 5 nm to about 100 nm. For example, the photoresist pattern 108 may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm.

On the other hand, the photoresist pattern 108 may have a pitch with a half-pitch of less than or equal to about 50 nm, for example, less than or equal to about 40 nm, for example less than or equal to about 30 nm, for example less than or equal to about 20 nm, or less than or equal to about 15 nm, and a line width roughness of less than or equal to about 10 nm, less than or equal to about 5 nm, less than or equal to about 3 nm, or less than or equal to about 2 nm.

Subsequently, the photoresist pattern 108 is utilized as an etching mask to etch the resist underlayer 104. Through this etching process, an organic layer pattern 112 is formed. The organic layer pattern 112 also may have a width corresponding to that of the photoresist pattern 108.

Figure 5:
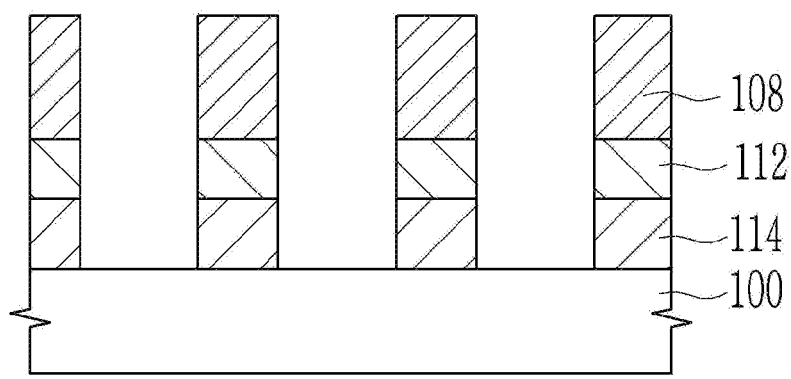

Referring to FIG. 5, the exposed thin film 102 is etched by applying the photoresist pattern 108 as an etching mask. As a result, the thin film is formed as a thin film pattern 114.

The etching of the thin film 102 may be, for example, dry etching utilizing an etching gas and the etching gas may be, for example, $CHF_3$, $CF_4$, $Cl_2$, $BCl_3$, or a mixed gas thereof.

In the exposure process, the thin film pattern 114 formed by utilizing the photoresist pattern 108 formed through the exposure process performed by utilizing an EUV light source may have a width corresponding to that of the photoresist pattern 108. In some embodiments, the thin film pattern 114 may have a width of 5 nm to 100 nm which is equal to (or substantially equal to) that of the photoresist pattern 108. In some embodiments, the thin film pattern 114 formed by utilizing the photoresist pattern 108 formed through the exposure process performed by utilizing an EUV light source may have a width of about 5 nm to about 90 nm, about 5 nm to about 80 nm, about 5 nm to about 70 nm, about 5 nm to about 60 nm, about 5 nm to about 50 nm, about 5 nm to about 40 nm, about 5 nm to about 30 nm, or about 5 nm to about 20 nm, and for example, a width of less than or equal to 20 nm, similar to (e.g., like) that of the photoresist pattern 108.

Hereinafter, the present disclosure will be described in more detail through examples of the preparation of the aforementioned semiconductor photoresist composition. However, the present disclosure is technically not restricted by the following examples.

EXAMPLES

Synthesis Example 1: Synthesis of Organotin Compound 1

25 ml of acetic acid was slowly added to a compound represented by Chemical Formula A-1 (10 g, 25.6 mmol) in a dropwise fashion at room temperature and then, heated under reflux at 110° C. for 24 hours.

Subsequently, after decreasing the temperature down to room temperature, the acetic acid was vacuum-distilled to obtain Organotin Compound 1 represented by Chemical Formula B-1 (Yield: 90%).

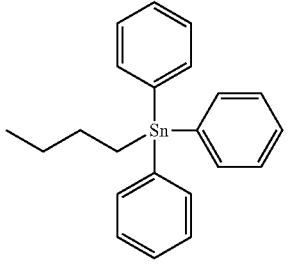

Chemical Formula A-1

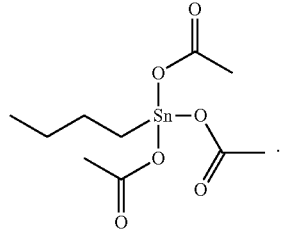

Chemical Formula B-1

Synthesis Example 2: Synthesis of Organotin Compound 2

25 ml of acrylic acid was slowly added in a dropwise fashion to a compound represented by Chemical Formula A-2 (10 g, 25.4 mmol) at room temperature and then, heated under reflux at 110° C. for 24 hours.

Subsequently, after decreasing the temperature down to room temperature, the acrylic acid was vacuum-distilled to obtain Organotin Compound 2 represented by Chemical Formula B-2 (Yield: 50%).

Chemical Formula A-2

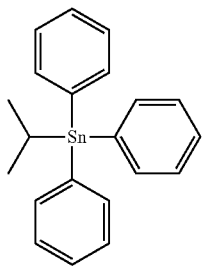

Chemical Formula B-2

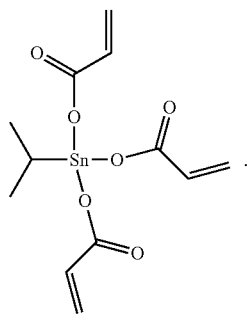

Synthesis Example 3: Synthesis of Organotin Compound 3

25 ml of propionic acid was slowly added in a dropwise fashion to a compound represented by Chemical Formula A-3 (10 g, 23.7 mmol) at room temperature and then, heated under reflux at 110° C. for 24 hours.

Subsequently, after decreasing the temperature down to room temperature, the propionic acid was vacuum-distilled to obtain Organotin Compound 3 represented by Chemical Formula B-3 (Yield: 95%).

Chemical Formula A-3

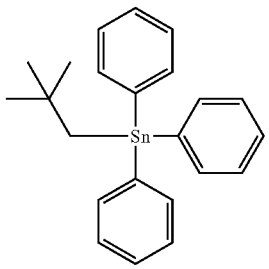

Chemical Formula B-3

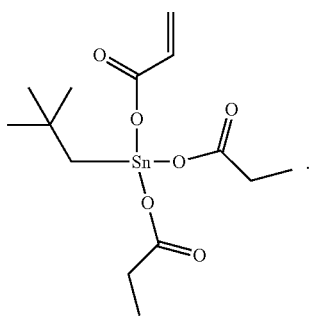

Synthesis Example 4: Synthesis of Organotin Compound 4

25 ml of isobutyric acid was slowly added in a dropwise fashion to a compound represented by Chemical Formula A-2 (10 g, 25.4 mmol) of Synthesis Example 2 at room temperature and then, heated under reflux at 110° C. for 24 hours.

Subsequently, after decreasing the temperature down to room temperature, the isobutyric acid was vacuum-distilled to obtain Organotin Compound 4 represented by Chemical Formula B-4 (Yield: 95%).

Chemical Formula B-4

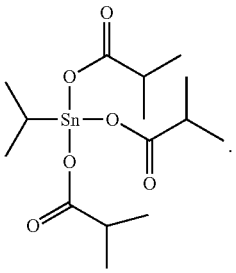

Synthesis Example 5: Synthesis of Organotin Compound 5

25 ml of propionic acid was slowly added in a dropwise fashion to a compound represented by Chemical Formula A-4 (10 g, 24.6 mmol) at room temperature and then, heated under reflux at 110° C. for 24 hours.

Subsequently, after decreasing the temperature down to room temperature, the propionic acid was vacuum-distilled to obtain Organotin Compound 5 represented by Chemical Formula B-5 (Yield: 90%).

Chemical Formula A-4

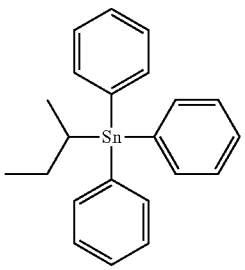

Chemical Formula B-5

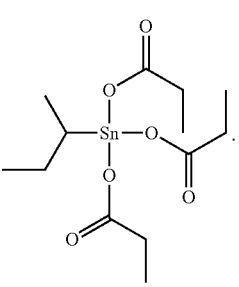

Examples 1 to 7

An organotin compound according to each of Synthesis Examples 1 to 5 was mixed with an organic acid compound as shown in Table 1 and then, added to PGMEA (propylene glycol methyl ether acetate, including 5 wt % of DIW (Deionized water)), thereby preparing solutions including solids at a concentration of 20 wt %.

The solutions were respectively stirred at 80° C. for 24 hours and cooled down to room temperature and then, diluted to have a solid of 3 wt % by utilizing an additional PGMEA solution to prepare condensate-containing solutions according to Examples 1 to 7, and then, the prepared solutions were respectively filtered with a 0.1 μm PTFE (polytetrafluoroethylene) syringe filter, thereby preparing the photoresist compositions.

TABLE 1

|  | Organotin Compound (A) | Organic acid Compound (B) | Content ratio (A:B) (wt %) |
|---|---|---|---|
| Example 1 | Chemical Formula B-1 | Glycolic acid | 97:3 |
| Example 2 | Chemical Formula B-2 | Glycolic acid | 97:3 |
| Example 3 | Chemical Formula B-3 | Malonic acid | 97:3 |
| Example 4 | Chemical Formula B-4 | Glycolic acid | 97:3 |
| Example 5 | Chemical Formula B-4 | Succinic acid | 97:3 |
| Example 6 | Chemical Formula B-5 | 1,2,3,4-Butane tetracarboxylic acid | 97:3 |
| Example 7 | Chemical Formula B-5 | Succinic acid | 97:3 |

Comparative Examples 1 to 5

The organotin compounds according to Synthesis Examples 1 to 5 were respectively dissolved in PGMEA at a solid concentration of 3 wt % and then, filtered with a 0.1 μm PTFE (polytetrafluoroethylene) syringe filter, thereby preparing photoresist compositions of Comparative Examples 1 to 5.

Evaluation 1: Evaluation of Sensitivity and Line Edge Roughness (LER)

Each of the photoresist compositions according to Examples 1 to 7 and Comparative Examples 1 to 5 was respectively spin-coated on a circular silicon wafer to form a film at 1500 rpm for 30 seconds. Each film was exposed to extreme ultraviolet radiation (E-beam) at an acceleration voltage of 100 kV to form 40 nm half-pitch nanowire patterns. The exposed films were each exposed to 170° C. for 60 seconds and dipped in a Petri dish containing 2-heptanone for 30 seconds and then, washed with the same solvent for 10 seconds. Finally, the washed films were baked at 150° C. for 180 seconds, and the obtained patterns were each imaged utilizing FE-SEM (field emission scanning electron microscopy). The formed pattern lines, which were confirmed through the FE-SEM images, were measured with respect to a critical dimension (CD) size and line edge roughness (LER), and then, sensitivity and line edge roughness of the films were evaluated according to the following criteria and then, are shown in Table 2.

※ Evaluation Criteria
(1) Sensitivity

The CD sizes measured at 1000 uC/cm$^2$ of energy were evaluated according to the following criteria, and the results are shown in Table 2.

◎: greater than or equal to 40 nm
○: greater than or equal to 35 nm and less than 40 nm
Δ: less than 35 nm
X: Pattern was not confirmed.
(2) Line Edge Roughness (LER)
○: less than or equal to 4 nm
Δ: greater than 4 nm and less than or equal to 7 nm
X: greater than 7 nm Evaluation 2: Evaluation of Storage Stability On the other hand, the photoresist compositions according to Examples 1 to 7 and Comparative Examples 1 to 5 were each evaluated with respect to storage stability, and the results are shown in Table 2.

Storage Stability

The photoresist compositions according to Examples 1 to 7 and Comparative Examples 1 to 5 were allowed to stand for a set or predetermined period at room temperature (20±5° C.) and then, examined with naked eyes with respect to a degree of precipitation and evaluated into 2 levels according to the following storability criteria.

※ Evaluation Criteria
○: can be stored for more than or equal to 6 months
Δ: can be stored between 3 months to 6 months
X: can be stored for less than 3 months

TABLE 2

|  | Sensitivity | LER (nm) | Storage Stability |
|---|---|---|---|
| Example 1 | ◎ | ○ | ○ |
| Example 2 | ◎ | ○ | ○ |
| Example 3 | ◎ | ○ | ○ |
| Example 4 | ◎ | ○ | ○ |
| Example 5 | ◎ | ○ | ○ |
| Example 6 | ◎ | ○ | ○ |
| Example 7 | ◎ | ○ | ○ |
| Comparative Example 1 | ○ | Δ | X |
| Comparative Example 2 | ◎ | X | X |
| Comparative Example 3 | ○ | Δ | X |
| Comparative Example 4 | ○ | Δ | Δ |
| Comparative Example 5 | ○ | Δ | X |

Referring to Table 2, the semiconductor photoresist compositions according to Examples 1 to 7 exhibited better (e.g., more excellent) storage stability than the semiconductor photoresist compositions according to Comparative Examples 1 to 5, and in addition, the patterns formed of the semiconductor photoresist compositions according to Examples 1 to 7 exhibited better (e.g., more excellent) sensitivity and line edge roughness (LER) than the patterns formed of the semiconductor photoresist compositions according to Comparative Examples 1 to 5.

As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively. As used herein, expressions such as "at least one of," "one of," and "selected from," when preceding a list of elements, modify the entire list of elements and do not modify the individual elements of the list. Throughout the disclosure, the expression "at least one of a, b or c" indicates only a, only b, only c, both a and b, both a and c, both b and c, all of a, b, and c, or variations thereof.

As used herein, the term "and/or" includes any and all combinations of one or more of the associated listed items. Further, the use of "may" when describing embodiments of the present disclosure refers to "one or more embodiments of the present disclosure".

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinbefore, the certain embodiments of the present disclosure have been described and illustrated, however, it is apparent to a person with ordinary skill in the art that the present disclosure is not limited to the embodiments described, and may be variously modified and transformed without departing from the spirit and scope of the present disclosure. Accordingly, the modified or transformed embodiments as such may not be understood separately from the technical ideas and aspects of the present disclosure, and the modified embodiments are within the scope of the claims of the present disclosure, and equivalents thereof.

| Description of Symbols | |
|---|---|
| 100: substrate | 102: thin film |
| 104: resist underlayer | 106: photoresist layer |
| 106a: exposed region | 106b: non-exposed region |
| 108: photoresist pattern | 112: organic layer pattern |
| 114: thin film pattern | |

What is claimed is:

1. A semiconductor photoresist composition, comprising:
   a condensed product produced by a condensation reaction between an organotin compound represented by Chemical Formula 1 and at least one organic acid compound selected from a substituted organic acid, an organic acid comprising at least two acid functional groups, and a substituted or unsubstituted sulfonic acid; and
   a solvent:

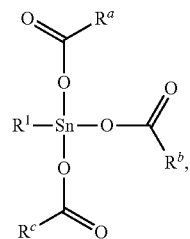

Chemical Formula 1 wherein, in Chemical Formula 1,
R$^1$ is a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, a substituted or unsubstituted C6 to C30 aryl group, or -L-O—R$^d$,
R$^a$, R$^b$, and R$^c$ are each independently a substituted or unsubstituted C1 to C20 alkyl group, a substituted or unsubstituted C3 to C20 cycloalkyl group, a substituted or unsubstituted C2 to C20 alkenyl group, a substituted or unsubstituted C2 to C20 alkynyl group, or a substituted or unsubstituted C6 to C30 aryl group,
L is a single bond, or a substituted or unsubstituted C1 to C20 alkylene group, and
R$^d$ is a substituted or unsubstituted C1 to C20 alkyl group, and
wherein a weight ratio of the organotin compound and the organic acid compound is about 85:15 to about 99:1.

2. The semiconductor photoresist composition of claim 1, wherein
   the substituted organic acid is substituted with a heteroatom, an atomic group comprising the heteroatom, or a combination thereof,
   the heteroatom is at least one of sulfur (S), nitrogen (N), oxygen (O), phosphorus (P), or fluorine (F), and
   the atomic group comprising the heteroatom is at least one of —OH, —SH, —NH$_2$, —S—, or —SS—.

3. The semiconductor photoresist composition of claim 1, wherein the organic acid compound comprises at least one of glycolic acid, malonic acid, succinic acid, 1,2,3,4-butane tetracarboxylic acid, citric acid, tartaric acid, tricarballylic acid, lactic acid, thioglycolic acid, dithiodiglycolic acid, thiodiglycolic acid, phthalic acid, maleic acid, L-aspartic acid, p-toluene sulfonic acid, methyl sulfonic acid, or benzene sulfonic acid.

4. The semiconductor photoresist composition of claim 1, wherein the organic acid compound has a pKa value of less than or equal to about 5.

5. The semiconductor photoresist composition of claim 1, wherein the condensed product is an oligomer, a polymer, or a combination thereof.

6. The semiconductor photoresist composition of claim 1, wherein the condensed product is a hydrolysis condensed product.

7. The semiconductor photoresist composition of claim 1, further comprising a surfactant, a crosslinking agent, a leveling agent, or a combination thereof.

8. A method of forming a pattern, the method comprising:
   forming an etching-objective layer on a substrate;
   coating the semiconductor photoresist composition of claim 1 on the etching -objective layer to form a photoresist layer;

patterning the photoresist layer to form a photoresist pattern; and etching the etching-objective layer utilizing the photoresist pattern as an etching mask.

9. The method of claim 8, wherein the photoresist pattern is formed utilizing light having a wavelength of about 5 nm to about 150 nm.

10. The method of claim 8, further comprising providing a resist underlayer between the substrate and the photoresist layer.

11. The method of claim 8, wherein the photoresist pattern has a width of about 5 nm to about 100 nm.

\* \* \* \* \*

UNITED STATES PATENT AND TRADEMARK OFFICE
CERTIFICATE OF CORRECTION

| | | |
|---|---|---|
| PATENT NO. | : 12,013,635 B2 | |
| APPLICATION NO. | : 17/454453 | |
| DATED | : June 18, 2024 | |
| INVENTOR(S) | : Kyungsoo Moon et al. | |

It is certified that error appears in the above-identified patent and that said Letters Patent is hereby corrected as shown below:

In the Claims

In Column 18, Line 66, in Claim 8, delete "etching -objective" and insert -- etching-objective --.

Signed and Sealed this
Twenty-second Day of October, 2024

*Katherine Kelly Vidal*

Katherine Kelly Vidal
*Director of the United States Patent and Trademark Office*